United States Patent
Ashikaga

(10) Patent No.: US 6,859,380 B2
(45) Date of Patent: Feb. 22, 2005

(54) FERROELECTRIC MEMORY AND METHOD OF OPERATING SAME

(75) Inventor: Kinya Ashikaga, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 142 days.

(21) Appl. No.: 10/247,291

(22) Filed: Sep. 20, 2002

(65) Prior Publication Data

US 2003/0076704 A1 Apr. 24, 2003

(30) Foreign Application Priority Data

Oct. 19, 2001 (JP) ........................................ 2001-322129

(51) Int. Cl.⁷ ............................................... G11C 11/22
(52) U.S. Cl. ................................. 365/145; 365/189.09
(58) Field of Search ............................. 365/145, 189.09

(56) References Cited

U.S. PATENT DOCUMENTS 5,010,518 A * 4/1991 Toda ........................... 365/145
5,608,667 A * 3/1997 Osawa ........................ 365/145
6,110,523 A * 8/2000 Yang ........................ 427/126.3

FOREIGN PATENT DOCUMENTS

| EP | 0 928 004 A2 | 7/1999 |
| JP | 11-260066 | 9/1999 |
| WO | WO 00/26919 | 5/2000 |

* cited by examiner

Primary Examiner—Michael Tran
(74) Attorney, Agent, or Firm—Volentine Francos, PLLC

(57) ABSTRACT

A ferroelectric memory reads data from a memory cell by using a sense amplifier to compare a reference potential with a potential produced on a bit line by the memory cell. The reference potential may generated by a pre-charge circuit connected to the sense amplifier. Alternatively, the reference potential may be generated by the memory cell itself. In either case, the reference potential is obtained without the need for a reference cell, and without the need to drive a bit line to the reference potential. Current consumption is accordingly reduced, and integration density can be increased.

13 Claims, 7 Drawing Sheets

FERROELECTRIC MEMORY AND METHOD OF OPERATING SAME

BACKGROUND OF THE INVENTION

1. Field of the Invention

The present invention relates to a ferroelectric memory and its method of operation, more particularly to the circuit structure of a ferroelectric memory and a method of reading data from a ferroelectric memory.

2. Description of the Related Art

Ferroelectric memory stores data in ferroelectric capacitors, which have an intrinsically bistable charge polarization, providing the advantage of nonvolatile data retention combined with comparatively rapid, low-voltage write access. Conventional ferroelectric memories include the 2T2C type that uses two transistors and two oppositely polarized capacitors to store one bit of data, and the 1T1C type that uses one transistor and one capacitor per bit. The 1T1C type is preferable for high-density memory designs.

A memory cell in a 1T1C ferroelectric memory is read by transferring charge between the ferroelectric capacitor and a bit line, and comparing the resulting bit-line potential with a reference potential. Normally, the reference potential is produced on another bit line, by a reference cell or dummy cell connected to the other bit line, but there are problems with this scheme. If the reference cell includes a conventional (paraelectric) capacitor, the reference potential may be inaccurate. If the reference cell includes a ferroelectric capacitor, it degrades more quickly than the ferroelectric capacitors in the data memory cells, because of the large number of times the reference cell is read, severely shortening the life of the memory device.

A type of 1T1C ferroelectric memory from which data can be read without reference cells has been proposed in, for example, U.S. Pat. No. 6,363,002 (and a corresponding Japanese Unexamined Patent Application Publication, No. 11-260066). In this memory, an unselected bit line is used as a reference. A read operation is carried out by supplying two opposed pulses: the first pulse elicits a data-dependent signal from the selected memory cell; the second pulse restores the selected bit line to a level for which the direct-current bias voltage on the unselected bit line is an optimal reference potential. A disadvantage of this scheme is that the reference potential depends on the bit-line capacitance, and extra current is consumed in biasing the unselected bit line.

SUMMARY OF THE INVENTION

An object of the present invention is to reduce the power consumption of a ferroelectric memory of the 1T1C type that does not use reference cells for reading data.

Another object of the invention is to increase the integration density of a ferroelectric memory.

A ferroelectric memory according to one aspect of the invention includes a memory cell having a ferroelectric capacitor connected directly to a plate line, and coupled through a selection transistor to a bit line. The selection transistor is controlled by a word line. The ferroelectric memory also includes a sense amplifier connected to the bit line, a plate line driver connected to the plate line, a first pre-charge circuit switchably coupled to the bit line, and a second pre-charge circuit connected to the sense amplifier. The first pre-charge circuit selectively supplies the ground potential and a first voltage, higher than the ground potential, to the bit line. During the reading of data from the memory cell, the second pre-charge circuit supplies the first voltage to the sense amplifier, and the plate line driver supplies the first voltage, a second voltage higher than the first voltage, and the ground potential to the plate line.

The first voltage generated by the second pre-charge circuit can serve as a reference potential to which the sense amplifier compares the bit-line potential. The second pre-charge circuit can be connected to the sense amplifier by a short reference line with a small parasitic capacitance, enabling the second pre-charge circuit and sense amplifier to operate with relatively low current consumption.

Data can be read from the above ferroelectric memory by the following sequence of operations:

(1) The plate line and bit line are driven to the first voltage.

(2) The first pre-charge circuit is disconnected from the bit line, which is left floating.

(3) The word line is asserted, turning on the selection transistor.

(4) The plate line is driven to the second voltage, then to the ground potential, then to the first voltage.

(5) The sense amplifier is activated, and the plate line is driven to the second voltage.

(6) The plate line is driven to the ground potential.

(7) The word line is deasserted, turning off the selection transistor.

(8) The sense amplifier is deactivated and the first pre-charge circuit is reconnected to the bit line.

Step (4) in this sequence leaves the ferroelectric capacitor in a partially polarized state different from its original polarization state, the direction of the difference depending on the stored data. The potential appearing on the bit line accordingly becomes higher or lower than the first voltage potential. In step (5), the sense amplifier senses the stored data value by amplifying this potential difference. Steps (5) and (6) also write the sensed data back into the memory cell.

The ferroelectric memory may include a plurality of memory cells as described above, connected in an array to a plurality of bit lines, word lines, and plate lines. A memory cell can be located at every intersection of a bit line with a word line, instead of at every other intersection as in conventional ferroelectric memories that use the bit lines as reference lines. The integration density of the memory can thus be increased. A further advantage is that in read access, only the accessed bit lines have to be driven to the first voltage.

A ferroelectric memory according to another aspect of the invention includes a first memory cell, a first bit line, a first complementary bit line, a first plate line, a first word line, a second memory cell, a second bit line, a second complementary bit line, a second plate line, and a second word line. The first memory cell has a first ferroelectric capacitor coupled to the first plate line, and coupled through a first selection transistor to the first bit line. The second memory cell has a second ferroelectric capacitor coupled to the second plate line, and coupled through a second selection transistor to the second bit line. The first and second selection transistors are controlled by the first and second word lines, respectively.

This ferroelectric memory also includes a first switch interconnecting the first bit line and first complementary bit line, a second switch interconnecting the first bit line and second complementary bit line, a third switch interconnecting the second bit line and second complementary bit line, a fourth switch interconnecting the second bit line and first complementary bit line, and a sense amplifier connected to the first and second complementary bit lines.

Data can be read from the first memory cell in this ferroelectric memory by the following sequence of operations:

(1) The first, second, third, and fourth switches are turned on; the first bit line, second bit line, first complementary bit line, and second complementary bit line are driven to a fixed (e.g., ground) potential, then left floating at this potential.

(2) The first word line is asserted, turning on the first selection transistor; then the first plate line is asserted.

(3) The first and fourth switches are turned off, disconnecting the first bit line and second bit line from the first complementary bit line.

(4) The first bit line, second bit line, and second complementary bit line are driven to the fixed potential.

(5) The first plate line is deasserted; then the third switch is turned off, leaving the second complementary bit line connected only to the first bit line.

(6) The first plate line is reasserted.

(7) The second switch is turned off, disconnecting the first bit line from the second complementary bit line, and the sense amplifier is activated to compare the potential on the first complementary bit line with the potential on the second complementary bit line.

(8) The first switch is turned on, reconnecting the first bit line to the first complementary bit line.

(9) The first plate line is deasserted.

(10) The sense amplifier is deactivated.

In this sequence, the potential on the second complementary bit line is used as a reference potential for reading the stored data from the first complementary bit line. The reference potential is generated by the memory cell itself, without the need for a reference cell or reference voltage generating circuit. Current consumption is lowered because the bit lines need be driven only to the ground potential during the reading of data.

DETAILED DESCRIPTION OF THE INVENTION

Figure 1:
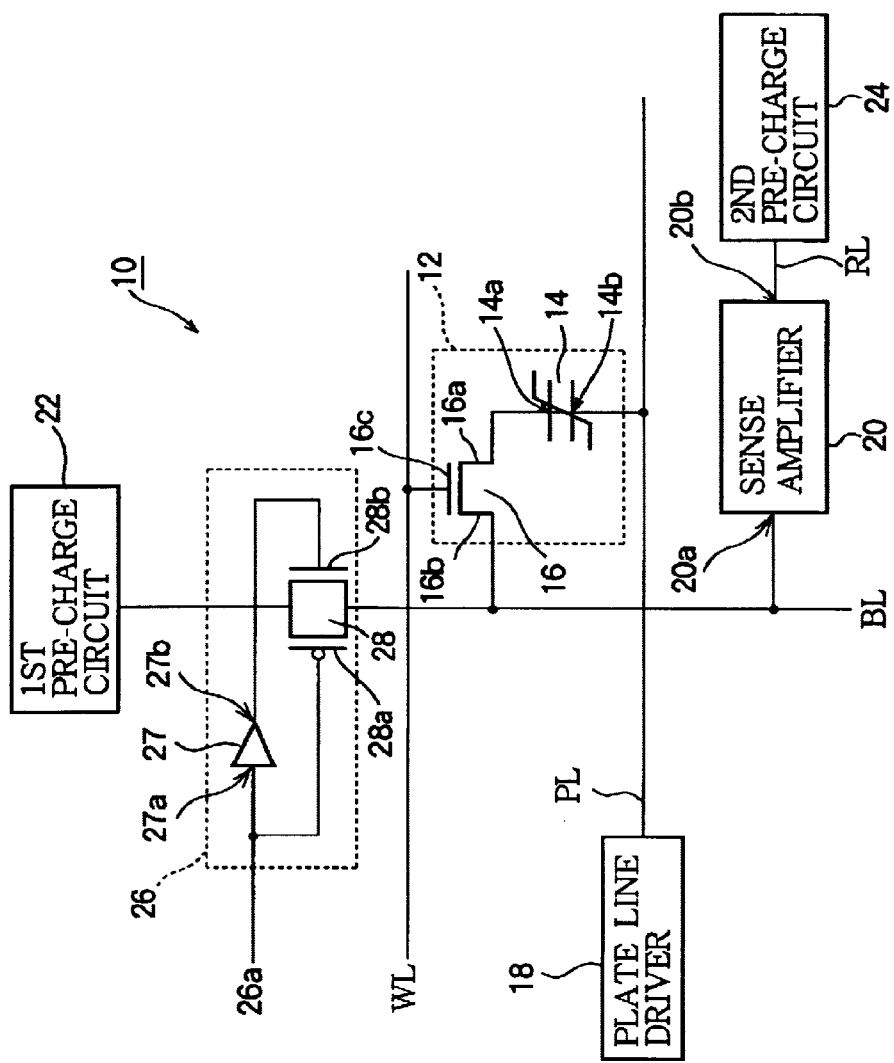
FIG. 1 is a circuit diagram schematically showing the structure of a ferroelectric memory according to a first embodiment of the invention.

Embodiments of the invention will now be described with reference to the attached drawings. In the drawings, the sizes and positional relationships of component elements are shown schematically, and are intended only to provide an understanding of the invention; the invention is not limited to the examples shown in the drawings.

The terms 'voltage' and 'potential' will be used interchangeably.

First Embodiment

FIGS. 1 to 4 illustrate the structure and data-reading method of a ferroelectric memory 10 according to a first embodiment of the invention. FIG. 1 schematically shows the circuit structure of the ferroelectric memory. FIGS. 2A and 2B schematically show examples of the internal structure of the plate line driver and pre-charge circuits in FIG. 1.

The ferroelectric memory device 10 in FIG. 1 includes a memory cell 12 having a single ferroelectric capacitor 14 with two electrodes 14a, 14b, and a selection transistor 16 with two main electrodes 16a, 16b and a control electrode 16c. If the selection transistor 16 is a field-effect transistor (FET), the two main electrodes are its source and drain electrodes, electrode 16b being the source electrode and electrode 16a the drain electrode, for example, and the control electrode 16c is a gate electrode.

In association with the memory cell 12, the ferroelectric memory device 10 includes a word line WL, a bit line BL, a plate line PL, a plate line driver 18, a sense amplifier 20 with two terminals 20a, 20b, a first pre-charge circuit 22, and a second pre-charge circuit 24. These elements are interconnected as follows.

The selection transistor 16 has its first main electrode 16a connected to one electrode 14a of the ferroelectric capacitor 14, its second main electrode 16b connected to the bit line BL, and its control electrode 16c connected to the word line WL. The other electrode 14b of the ferroelectric capacitor 14 is coupled to the plate line PL. One end of the plate line PL is connected to the output terminal of the plate line driver 18. The output terminal of the first pre-charge circuit 22 is coupled to the bit line BL through a switch 26.

The switch 26 includes an inverter 27, and a p-channel metal-oxide-semiconductor (PMOS) transistor and an n-channel metal-oxide-semiconductor (NMOS) transistor forming a complementary metal-oxide-semiconductor (CMOS) transmission gate 28. The input terminal 26a of the switch 26 is connected to the gate electrode 28a of the PMOS transistor and the input terminal 27a of the inverter 27. The output terminal 27b of the inverter 27 is connected to the gate electrode 28b of the NMOS transistor. The input terminal 26a of the switch 26 is also connected to a control circuit, not shown in the drawing, from which it receives a control signal with high and low logic levels.

The bit line BL is connected to the first terminal 20a of the sense amplifier 20; the output terminal of the second pre-charge circuit 24 is connected to the second terminal 20b of the sense amplifier 20 through a reference line RL.

The plate line driver 18 is a voltage generator that drives the plate line PL to various desired potentials. In this memory, the plate line driver 18 selectively generates a ground voltage for driving the plate line PL to the ground potential level, and a pair of higher voltages. The first of these higher voltages drives the plate line PL to a reference potential level. The second voltage is higher than the first voltage.

The first pre-charge circuit 22 is a voltage generator that generates a pair of voltages and drives the bit line BL to corresponding potentials. In this memory, the first pre-charge circuit 22 selectively generates the ground voltage (driving the bit line BL to the ground potential) and the first voltage (driving the bit line BL to the reference potential).

The second pre-charge circuit 24 is a voltage generator that generates the first voltage and drives the reference line RL, thereby supplying the first voltage, or reference potential, to the sense amplifier 20 during read operations.

Figure 2A:
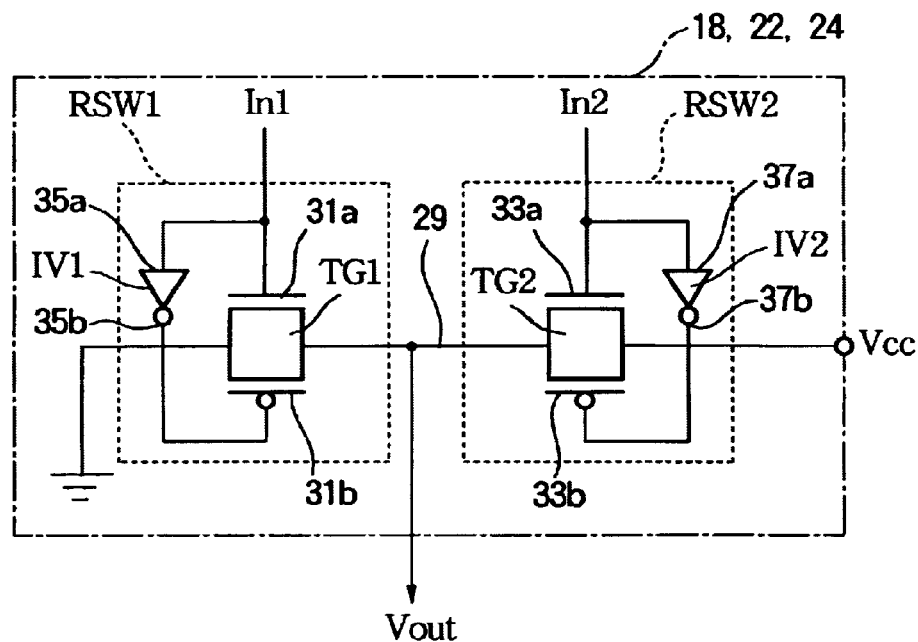
FIG. 2A is a circuit diagram showing an example of the structure of the plate line driver, first pre-charge circuit, and second pre-charge circuit in FIG. 1.

The plate line driver 18, first pre-charge circuit 22, and second pre-charge circuit 24 may all have the same structure: for example, the structure shown in FIG. 2A. The plate line driver 18 may be part of an access circuit that also controls the word line WL.

When the sense amplifier 20 is activated, the first terminal 20a of the sense amplifier 20 receives a potential that has been established on the bit line BL responsive to the polarization state of the ferroelectric capacitor 14, representing the data stored in the memory cell 12. The second terminal 20b of the sense amplifier 20 receives the reference potential supplied from the second pre-charge circuit 24. The sense amplifier 20 senses whether the potential received at the first terminal 20a is higher or lower than the reference potential received at the second terminal 20b by amplifying the potential difference until the bit line BL is at either the ground level or the power supply voltage level.

The first voltage or reference potential is higher than the ground voltage and lower than the power supply voltage. The second voltage is higher than the first voltage and preferably equal to or less than the power supply voltage, as this simplifies the circuit configuration of the plate line driver 18. The plate line driver 18 has the simplest circuit configuration if the second voltage is equal to the power supply voltage. In the following description of this embodiment, it will be assumed that the second voltage is equal to the power supply voltage (Vcc), the first voltage is one-half the power supply voltage (Vcc/2), and the ground voltage is zero volts (0 V). The exemplary structure shown in FIG. 2A enables the plate line driver 18, first pre-charge circuit 22, and second pre-charge circuit 24 to selectively generate any of these voltages (0 V, Vcc/2, and Vcc).

The circuit shown in FIG. 2A includes a conductive path 29 leading from a power supply node (Vcc) through a first switch RSW1 and a second switch RSW2 to a ground node. An output node is disposed on the conductive path 29 between the first switch RSW1 and second switch RSW2. The two switches RSW1 and RSW2 have identical structures, each including an inverter (IV1 and IV2) and a CMOS transmission gate (TG1 and TG2). The input terminals In1 and In2 of the two switches RSW1 and RSW2 are connected to gate electrodes 31a and 33a of the NMOS transistors in the transmission gates TG1 and TG2 and input terminals 35a and 37a of the inverters IV1 and IV2. The output terminals 35b and 37b of the inverters IV1 and IV2 are connected to the gate electrodes 31b and 33b of the PMOS transistors in the transmission gates TG1 and TG2. The PMOS and NMOS transistors in the transmission gates TG1 and TG2 are sized so that even when the transmission gates are switched on, the switches RSW1, RSW2 provide a predetermined resistance on the conductive path 29.

In this circuit, if a high-logic-level signal is input to the input terminal In1 of the first switch RSW1 and a low-logic-level signal is input to the input terminal In2 of the second switch RSW2, the first switch RSW1 turns on, the second switch RSW2 turns off, and the output voltage Vout obtained from the output node is 0 V. If a low-logic-level signal is input to the input terminal In1 of the first switch RSW1 and a high-logic-level signal is input to the input terminal In2 of the second switch RSW2, the first switch RSW1 turns off, the second switch RSW2 turns on, and the output voltage Vout is Vcc. If a high-logic-level signal is input to the input terminals of both switches RSW1 and RSW2, both switches turn on, and the output voltage Vout is Vcc/2, the on-resistances of the switches RSW1, RSW2 acting as a voltage divider. Controlling the switching operations of the first and second switches RSW1, RSW2 in this way enables the plate line driver 18 to selectively generate 0 V, Vcc/2, and Vcc. This circuit design can also be used in the first pre-charge circuit 22 and second pre-charge circuit 24.

Figure 2B:
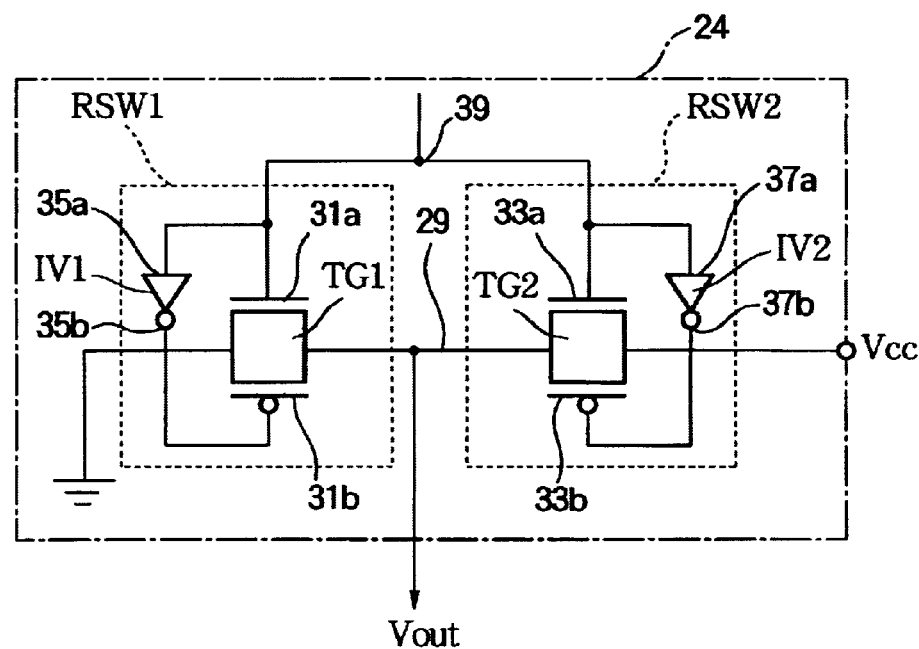
FIG. 2B is a circuit diagram showing another example of the structure of the second pre-charge circuit in FIG. 1.

If this circuit is used as the second pre-charge circuit 24, the input terminals of the first and second switches RSW1, RSW2 may be interconnected by a common input path 39, as shown in FIG. 2B. When a high-logic-level signal is received on the common input path 39, the output voltage Vout is Vcc/2.

Next, the reading of data stored in the memory cell 12 of the ferroelectric memory device 10 will be described with reference to FIGS. 3 and 4.

Figure 3:
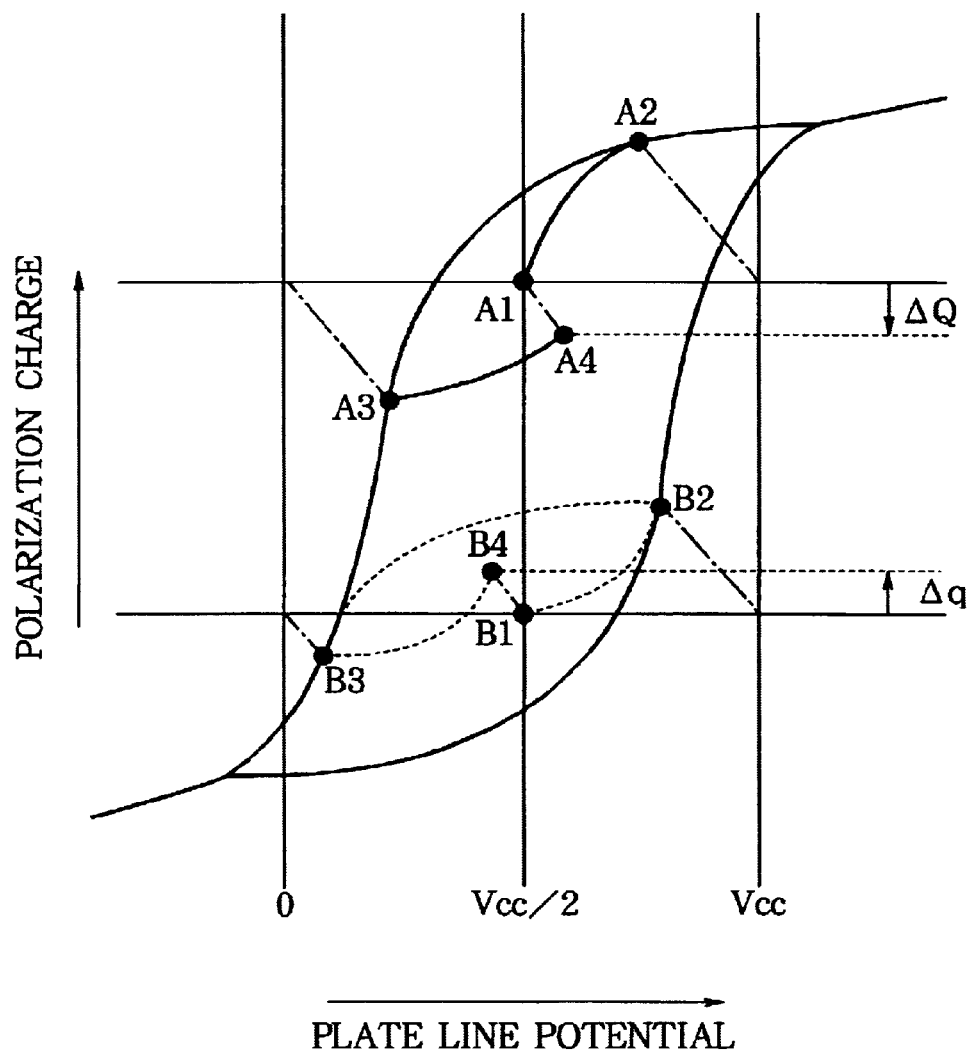
FIG. 3 is a graph showing polarization state transitions of the ferroelectric capacitor in FIG. 1.

FIG. 3 is a graph plotting polarization state transitions of the ferroelectric capacitor in FIG. 1: the horizontal axis of the graph indicates the plate potential in volts (V); the vertical axis indicates the polarization state, also referred to as the polarization charge. The outer loop is the hysteresis loop between the positively and negatively saturated polarization states.

Figure 4:
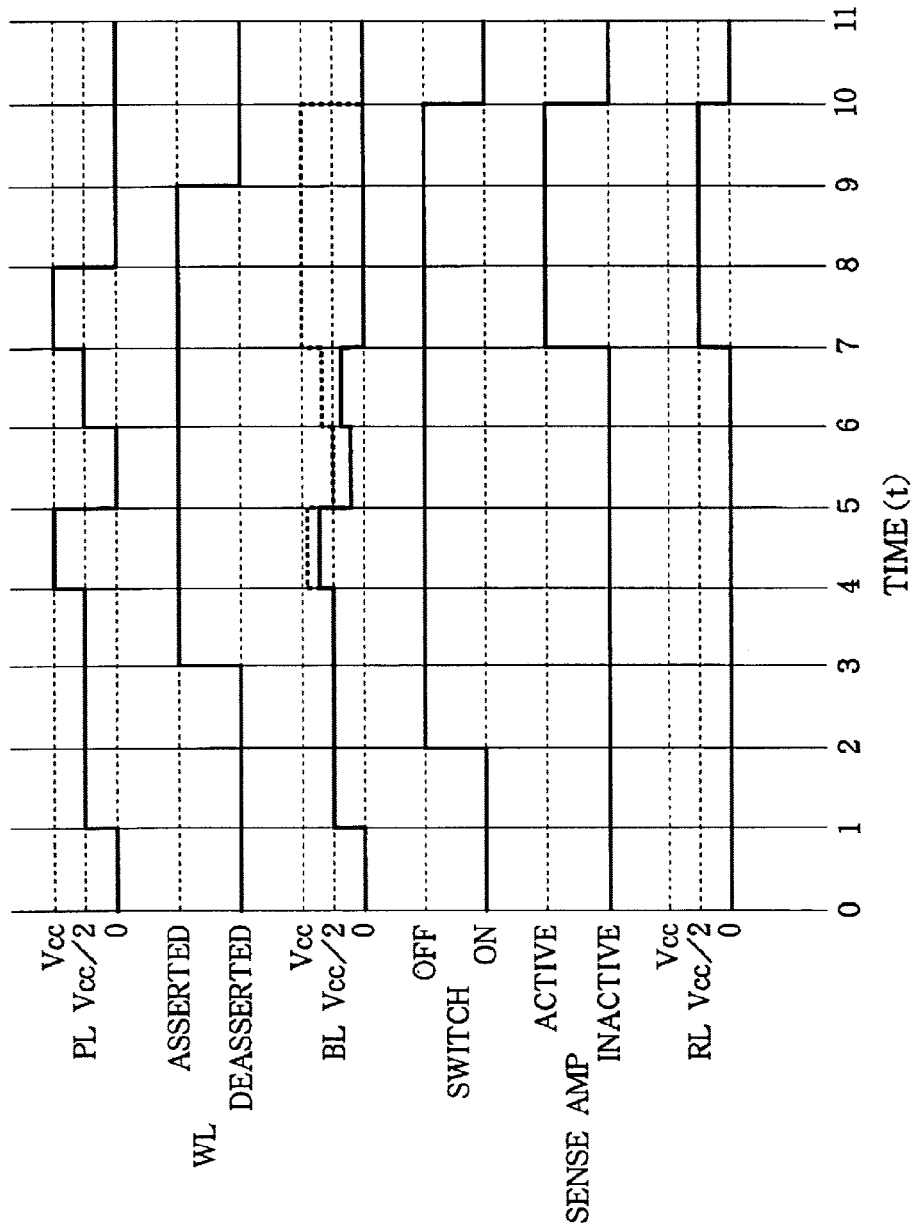
FIG. 4 is a timing diagram indicating potential changes and state changes when the ferroelectric memory in FIG. 1 is read.

FIG. 4 is a timing diagram that indicates potential changes on the plate line PL, word line WL, bit line BL, and reference line RL with respect to time. The on/off timing of the switch 26 and the activation/deactivation timing of the sense amplifier 20 are also indicated on the same time axis.

Initially, at time t=0, the plate line PL, bit line BL, and word line WL are at the same potential, assumed here to be the ground potential (0 V). The ferroelectric capacitor 14 is in a partially polarized state indicated by point A1 or B1 in FIG. 3, depending on the data stored in the memory cell 12.

At time t=1, the first voltage (Vcc/2) is applied to the plate line PL and bit line BL to raise their potentials to the first voltage level (Vcc/2). This embodiment applies the first voltage to the plate line PL from the plate line driver 18 and to the bit line BL from the first pre-charge circuit 22.

At time t=2, the bit line BL is placed in an electrically floating state. In this embodiment, switch 26 is turned off by a high-logic-level signal received at its input terminal 26a to electrically disconnect the bit line BL from the first pre-charge circuit 22.

At time t=3, the word line WL is asserted (driven to the Vcc level or a higher potential level) to turn on the selection transistor 16, permitting it to conduct charge between the bit line BL and the first electrode 14a of the ferroelectric capacitor 14. Since the bit-line potential (Vcc/2) is identical to the plate-line potential at the second electrode 14b of the ferroelectric capacitor 14, no charge is transferred between the ferroelectric capacitor 14 and the bit line BL at this time.

At time t=4, the second voltage is applied to the plate line PL. In this embodiment, the power supply voltage (Vcc) is supplied as the second voltage from the plate line driver 18 to the plate line PL. The polarization state of the ferroelectric capacitor 14 now changes as shown in FIG. 3. If the ferroelectric capacitor was in the state represented by point A1, its state moves to point A2; if the ferroelectric capacitor was in the state represented by point B1, its state moves to point B2.

In FIG. 3, dash-dot lines with slopes corresponding to the bit-line capacitance are drawn through the points of intersection of the vertical lines indicating plate-line potentials and the horizontal lines indicating the ferroelectric capacitor charge at points A1 and B1. Points A2 and B2 are located on the dash-dot lines leading from the Vcc plate potential line.

When the plate-line potential rises, charge is transferred from the ferroelectric capacitor 14 to the bit line BL, but the amount of charge transfer differs depending on the polarization direction of the ferroelectric capacitor 14. If the ferroelectric capacitor 14 changes from state A1 to A2 at time t=4, its charge changes by more than if the change is from state B1 to B2, and the charge on the bit line BL changes by correspondingly less. Since the state transition from B1 to B2 transfers more charge to the bit line than does the transition from A1 to A2, the bit-line potential is raised to a higher level by the B1–B2 transition than by the A1–A2 transition. The bit-line potential resulting from the A1–A2 state transition at time t=4 is indicated by a solid line in FIG. 4; the bit-line potential resulting from the B1–B2 state transition is indicated by a dashed line.

At time t=5, the plate line PL is driven down to the ground potential by application of 0 V to the plate line PL from the plate line driver 18. The ferroelectric capacitor 14 changes from state A2 to state A3 (FIG. 3), if the ferroelectric capacitor was in state A2 at time t=4, or from state B2 to state B3, if the ferroelectric capacitor was in state B2 at time t=4. Responsive to this change, the potential on the bit line drops as shown in FIG. 4.

At time t=6, the plate line PL is again raised to the reference potential by application of the first voltage (Vcc/2) from the plate line driver. This changes the state of the ferroelectric capacitor from point A3 to point A4, or from point B3 to point B4 (FIG. 3), in either case leaving the ferroelectric capacitor 14 in a partially polarized state. Responsive to this change, the potential appearing on the bit line BL rises to a level that is either higher than or lower than the Vcc/2 level, depending on the initial polarization state of the ferroelectric capacitor 14.

If the ferroelectric capacitor 14 was initially in state A1 in FIG. 3 when the plate line PL was at the first voltage (Vcc/2), application of the second voltage (Vcc), ground voltage (0 V), and first voltage (Vcc/2) to the plate line PL in this order causes the state of the ferroelectric capacitor 14 to change from point A1 to A2, then to A3, then to A4. As a result, at time t=6, the polarization charge of the ferroelectric capacitor 14 becomes lower than point A1 by a margin of $\Delta Q$. The potential appearing on the bit line BL at time t=6 can be calculated as $Vcc/2 - \Delta Q/Cb$, where Cb is the bit-line capacitance. As shown in FIG. 4, this potential is lower than the first potential (Vcc/2).

If the ferroelectric capacitor 14 was initially in state B1 in FIG. 3, application of the same voltages Vcc, 0 V, and Vcc/2 to the plate line PL causes the state of the ferroelectric capacitor 14 to change from point B1 to B2, then to B3, then to B4. As a result, at time t=6, the polarization charge of the ferroelectric capacitor 14 becomes higher than point B1 by a margin of $\Delta q$. The potential appearing on the bit line BL at time t=6 can be calculated as $Vcc/2 + \Delta q/Cb$, which is higher than the first potential (Vcc/2), as shown in FIG. 4.

Next, at time t=7, the plate line PL is driven to the second voltage (Vcc). At the same time, the sense amplifier 20 is activated, and the first voltage (the reference potential Vcc/2) is supplied from the second pre-charge circuit 24 to the reference line RL. The sense amplifier 20 compares the potential on the bit line BL with the reference potential (Vcc/2). The sense amplifier 20 is activated by an activation signal from a control circuit, not shown in the drawings, that is connected to the sense amplifier 20 and controls the activation timing.

When the sense amplifier 20 is activated, the potential on the bit line BL is at a level either higher than the first potential by a margin of $\Delta q/Cb$, or lower than the first potential by a margin of $\Delta Q/Cb$, depending on the data stored in the memory cell 12 (originally represented by point A1 or B1 in FIG. 3), as described above.

If the potential on the bit line BL is higher than the first potential, the potential difference is amplified by the sense amplifier 20 until the bit-line potential is equal to the power supply potential (Vcc). Similarly, if the potential on the bit line BL is lower than the first potential, the potential difference is amplified until the bit-line potential is equal to the ground potential (0 V). The stored data value has now been sensed as the high or low logic level (Vcc or 0 V) on the bit line. The sensed logic level is transferred from the bit line to an output circuit (not shown) for output as read data.

At time t=8, the plate line PL is driven to the ground level (0 V). Since the sense amplifier 20 has driven the bit line BL to either 0 V or Vcc at time t=7, at either time t=7 or time t=8 the ferroelectric capacitor 14 is restored to the polarization direction corresponding to the sensed data. That is, the sensed data value is written back.

At time t=9, the word line is deasserted (e.g., driven to 0 V), turning off the selection transistor 16 and disconnecting the ferroelectric capacitor 14 from the bit line BL.

At time t=10, the sense amplifier 20 is deactivated, the switch 26 is turned on, and the bit line is returned to the ground potential (0 V) by the first pre-charge circuit 22, restoring the ferroelectric memory device 10 to its initial state at time t=0.

The sequence in FIG. 4 can be altered in various ways. For example, the second pre-charge circuit 24 can be turned on at time t=6 to pre-charge the reference line RL to the reference level (Vcc/2), then turned off at time t=7 to let the sense amplifier 20 drive the reference line RL to the high or low logic level (Vcc or 0 V).

Although the ferroelectric memory device 10 shown in FIG. 1 has only a single bit line, plate line, word line, and memory cell, the first embodiment is also applicable to a memory having a plurality of bit lines, plate lines, and word lines arranged in a row-column matrix array. A memory cell may be disposed at each location at which a bit line crosses a word line and a plate line. When a word line is asserted, all of the memory cells connected to it may be read simultaneously by the operation described above, or a selected group of memory cells may be read.

In the first embodiment, the plate line driver selectively generates a ground (0 V) potential, a first potential higher than 0 V, and a second potential higher than the first potential. By placing the plate line and bit line at the first potential, then floating the bit line and driving the plate line PL from the first potential to the second potential, then to 0 V, then back to the first potential, the first embodiment maneuvers the ferroelectric capacitor into a partially polarized state in which the bit-line potential is either higher or lower than the first potential. Data can then be sensed by comparing the bit-line potential with the first potential as a reference potential. The first potential can be set to a convenient level such as Vcc/2. There is no need for a reference cell or dummy cell to generate a reference potential accurately matched to the electrical characteristics of the memory cell.

If the second potential is set to the power supply potential (Vcc) and the first potential is set to Vcc/2, for example, the plate line driver can have a particularly simple circuit configuration, as can the first pre-charge circuit that pre-charges the bit line.

A particular feature of the first embodiment is that the sense amplifier receives the reference potential from a second pre-charge circuit through a short reference line RL, instead of through an unselected bit line. The second pre-charge circuit can therefore be designed without concern for the bit-line capacitance. Since neither the second pre-charge circuit nor the sense amplifier has to drive the large capacitive load of an unselected bit line, data can be read with less power consumption than in conventional 1T1C ferroelectric memories.

Since the first embodiment uses the first potential as the reference potential, setting the first potential to Vcc/2 also allows the second pre-charge circuit to have a simple circuit configuration and operate in a stable manner.

Since there is no need to use unselected bit lines as reference lines, the first embodiment can increase the integration density of a ferroelectric memory by doubling the number of memory cells connected to a given number of bit lines, or by halving the number of bit lines needed for a given number of memory cells.

Second Embodiment

Next, the structure and data reading method of a ferroelectric memory according to a second embodiment of the invention will be described with reference to FIGS. 5 to 7.

Figure 5:
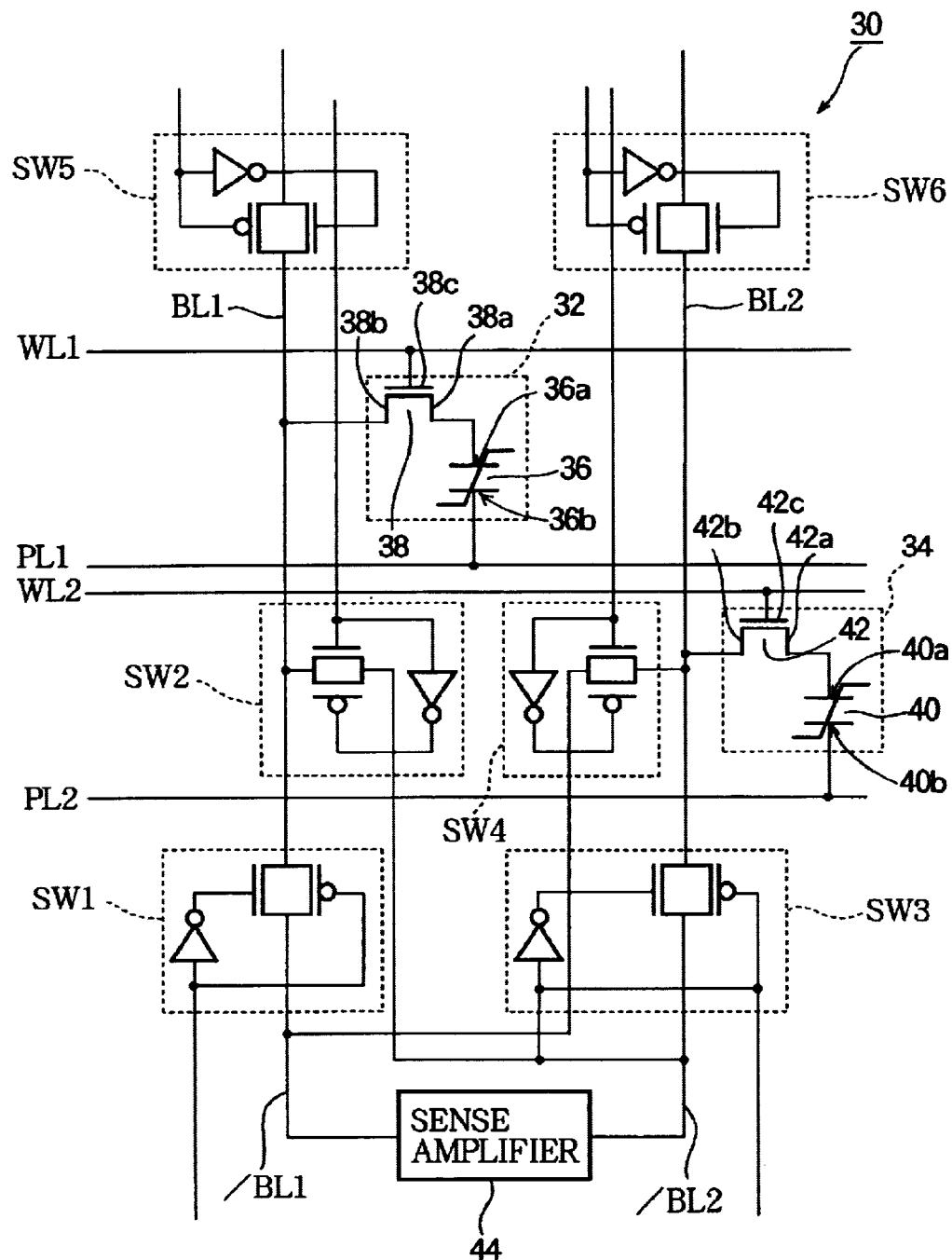
FIG. 5 is a circuit diagram schematically showing the structure of a ferroelectric memory according to a second embodiment of the invention.

FIG. 5 schematically shows the circuit structure of the ferroelectric memory in this embodiment. The ferroelectric memory device 30 in FIG. 5 includes at least a first memory cell 32 and a second memory cell 34.

The first memory cell 32 has a first ferroelectric capacitor 36 and a first selection transistor 38, such as a field-effect transistor (FET). The first memory cell 32 is connected to a first bit line BL1, first plate line PL1, and first word line WL1.

More specifically, a first main electrode 38a, such as a drain electrode, of the first selection transistor 38 is connected to one electrode 36a of the first ferroelectric capacitor 36. A second main electrode 38b, such as a source electrode, of the first selection transistor 38 is connected to the first bit line BL1. A control electrode 38c, such as a gate electrode, of the first selection transistor 38 is connected to the first word line WL1. The other electrode 36b of the first ferroelectric capacitor 36 is connected to the first plate line PL1.

The second memory cell 34 has a second ferroelectric capacitor 40 and a second selection transistor (e.g., FET) 42, which are connected to a second bit line BL2, second plate line PL2, and second word line WL2 in an analogous fashion. A first main electrode (e.g., drain electrode) 42a of the second selection transistor 42 is connected to one electrode 40a of the second ferroelectric capacitor 40. A second main electrode (e.g., source electrode) 42b of the second selection transistor 42 is connected to the second bit line BL2. A control electrode (e.g., gate electrode) 42c of the second selection transistor 42 is connected to the second word line WL2. The other electrode 40b of the second ferroelectric capacitor 40 is connected to the second plate line PL2.

The first bit line BL1 is connected to one end of a first complementary bit line /BL1 through a first switch SW1, and to a second complementary bit line /BL2 through a second switch SW2. The second bit line BL2 is connected to one end of the second complementary bit line /BL2 through a third switch SW3, and to the first complementary bit line /BL1 through a fourth switch SW4. A sense amplifier 44 is connected to the other ends of the first complementary bit line /BL1 and the second complementary bit line /BL2.

The ferroelectric memory device 30 also has a fifth switch SW5 connected to the bit line BL1 at the opposite end from the first switch SW1. When the fifth switch SW5 is turned on, a voltage is applied to the first bit line BL1 by a circuit not shown in the drawing. Similarly, a sixth switch SW6 is connected to the second bit line BL2 at the opposite end from the third switch SW3. When the sixth switch SW6 is turned on, a voltage is applied to the second bit line BL2 by a circuit not shown in the drawing. When the fifth and sixth switches SW5 and SW6 are turned off, the first and second bit lines BL1 and BL2 are left in a floating state.

The first switch SW1 includes an inverter and a CMOS transmission gate. The input terminal of the first switch SW1 is connected to the gate electrode of the PMOS transistor in the transmission gate and to the input terminal of the inverter. The output terminal of the inverter is connected to the gate electrode of the NMOS transistor in the transmission gate. The third, fifth, and sixth switches SW3, SW5, and SW6 have structures identical to that of the first switch SW1. These switches turn on when their input terminals are at the low logic level, and turn off when their input terminals are at the high logic level.

The second switch SW2 and the fourth switch SW4 also include an inverter and a CMOS transmission gate. The input terminals of the second and fourth switches SW2 and SW4 are connected to the gate electrodes of NMOS transistors in the respective transmission gates, and to the input terminals of the respective inverters. The output terminal of each inverter is connected to the gate electrode of the PMOS transistor in the respective transmission gate. Therefore, the second and fourth switches SW2 and SW4 turn on when their input terminals are at the high logic level, and turn off when their input terminals are at the low logic level.

The logic levels of the input terminals of the first to sixth switches SW1 to SW6 are controlled by signals from an external timing control circuit not shown in the drawing.

The reading of data stored in the first memory cell 32 in the ferroelectric memory device 30 will be described with reference to FIG. 6, which indicates potential changes on the first plate line PL1, first word line WL1, first bit line BL1, first complementary bit line /BL1, second bit line BL2, and second complementary bit line /BL2 with respect to time. The on/off timing of the six switches SW1 to SW6 and the activation/deactivation timing of the sense amplifier 44 are also indicated on the same time axis.

Initially, at time t=0, the first to sixth switches SW1 to SW6 are in the on state, the first bit line BL1, second bit line BL2, first complementary bit line /BL1, and second complementary bit line /BL2 are electrically interconnected, and the ground voltage is applied through switches SW5 and SW6, placing these lines at the ground potential (0 V)

At time t=1, the fifth and sixth switches SW5 and SW6 are turned off, leaving the first bit line BL1, second bit line BL2, first complementary bit line /BL1, and second complementary bit line /BL2 in an electrically floating state.

At time t=2, the first word line WL1 is asserted, causing the first selection transistor 38 to enter the conducting state.

At time t=3, the first plate line PL1 is asserted, applying a voltage to the first ferroelectric capacitor 36 and causing a potential responsive to the polarization state of the first ferroelectric capacitor 36 to appear on the first bit line BL1, second bit line BL2, first complementary bit line /BL1, and second complementary bit line /BL2. This potential will be referred to below as the first potential ($V_{1BL}$). The polarization state of the first ferroelectric capacitor 36 represents a binary data value, so the first potential ($V_{1BL}$) may have either of two levels: the higher level will be denoted $V_{1BLH}$ and the lower level $V_{1BLL}$. In FIG. 6, $V_{1BLH}$ is indicated by a dashed line and $V_{1BLL}$ by a solid line.

At time t=4, the first switch SW1 and fourth switch SW4 are turned off, electrically disconnecting the first bit line BL1 and second bit line BL2 from the first complementary bit line /BL1. The first complementary bit line /BL1 is left floating at the higher or lower level $V_{1BLH}$ or $V_{1BLL}$ of the first potential $V_{1BL}$.

At time t=5, the second switch SW2 is turned off, electrically disconnecting the first bit line BL1 from the second complementary bit line /BL2; in addition, the fifth and sixth switches SW5 and SW6 are turned on and the first bit line BL1, second bit line BL2 and second complementary bit line /BL2 are driven to 0 V. The first ferroelectric capacitor 36 now becomes polarized in the positive direction, consistent with the voltage between the first bit line and first plate line, even if it was initially polarized in the opposite direction.

At time t=6, the first plate line PL1 is deasserted. The first ferroelectric capacitor 36 remains polarized in the positive direction.

At time t=7, the second switch SW2 is turned on and the third switch SW3 and the fifth switch SW5 are turned off, electrically disconnecting the second bit line BL2 from the second complementary bit line /BL2, and electrically connecting the first bit line BL1 to the second complementary bit line /BL2. The first bit line BL1 and the second complementary bit line /BL2 are now both floating at the 0-V potential.

At time t=8, the first plate line PL1 is reasserted and the first ferroelectric capacitor 36 receives the same voltage, in the same direction, as at time t=3. Since the first ferroelectric capacitor 36 was polarized in this direction at time t=5, a second potential ($V_{2BL}$), responsive to the consistent polarization state and indicated by a solid line in FIG. 6, appears on the first bit line BL1 and the second complementary bit line /BL2.

At time t=9, the second switch SW2 is turned off to electrically disconnect the first bit line BL1 from the second complementary bit line /BL2, and the sense amplifier 44 is activated to compare the potential ($V_{1BLH}$ or $V_{1BLL}$) on the first complementary bit line /BL1 with the potential ($V_{2BL}$) on the second complementary bit line /BL2. The first complementary bit line /BL1 retains the first potential ($V_{1BL}$) that appeared at time t=3; the second complementary bit line /BL2 is at the second potential ($V_{2BL}$) that appeared at time t=8. Therefore, the sense amplifier 44 compares the first potential ($V_{1BL}$) with the second potential ($V_{2BL}$)

As will be shown below, the first potential ($V_{1BL}$) may have a level ($V_{1BLH}$) higher than the second potential ($V_{2BL}$) or a level ($V_{1BLL}$) lower than the second potential ($V_{2BL}$) depending on the data stored in the first memory cell 32. If the first potential ($V_{1BL}$) is higher than the second potential ($V_{2BL}$), the potential difference ($V_{1BLH}-V_{2BL}$) is amplified by the sense amplifier 44 so that at time t=9, the first complementary bit line /BL1 goes to the power supply level (Vcc) and the second complementary bit line /BL2 goes to the ground level (0 V), as indicated by dashed lines in FIG. 6. If the first potential ($V_{1BL}$) is lower than the second potential ($V_{2BL}$), the difference ($V_{2BL}-V_{1BLL}$) is amplified so that the first complementary bit line /BL1 goes to 0 V and the second complementary bit line /BL2 goes to the Vcc, as indicated by solid lines in FIG. 6.

At time t=10, the first switch SW1 is turned on, electrically connecting the first bit line BL1 to the first complementary bit line /BL1. The sense amplifier 44 now drives the first bit line BL1 to the same potential as the first complementary bit line /BL1, either the power supply potential (Vcc) or the ground potential (0 V).

At time t=11, the first plate line PL1 is deasserted.

At time t=12, the sense amplifier 44 is deactivated. During the operations from time t=10 to time t=12, either before or after time t=11, the same voltage is applied to the first ferroelectric capacitor 36, in the same direction, as was applied to write the stored data prior to time t=0. If the polarization direction of the first ferroelectric capacitor 36 has been reversed by the data reading operations so far, it is now restored to the original polarization direction, rewriting the original data.

At time t=13, the third and fifth switches SW3 and SW5 are turned on and both bit lines BL1, BL2 and both complementary bit lines /BL1, /BL2 are driven to the ground level (0 V). The second and fourth switches SW2 and SW4 may also be turned on at this time.

At time t=14, the first word line WL1 is deasserted, turning off the first selection transistor 38. This completes the read operation sequence.

In this embodiment, the potential elicited from the data stored in the first memory cell 32 is the first potential ($V_{1BL}$) that appears at time t=3. At this time, the first bit line BL1, second bit line BL2, first complementary bit line /BL1, and second complementary bit line /BL2 are all electrically interconnected. Accordingly, the bit-line capacitance ($C_{BL}$) involved in producing the first potential ($V_{1BL}$) can be represented by the following equation (1). The capacitance of the first complementary bit line /BL1 is on the order of one hundredth of the capacitance of the first bit line BL1. The capacitance of the second complementary bit line /BL2 is similarly about one hundredth of the capacitance of the second bit line BL2. For practical purposes, accordingly, the capacitances of the complementary bit lines can be ignored.

$$C_{BL}=C_{BL1}+C_{BL2}+C_{/BL1}+C_{/BL2}\approx C_{BL1}+C_{BL2}=2C_{BL1} \quad (1)$$

Thus, the first potential ($V_{1BL}$) can be represented by the following equation (2).

$$V_{1BL}=Q/(2C_{BL1}+C_S) \quad (2)$$

In this equation, Q represents the amount of charge transferred from the first ferroelectric capacitor 36 to the first and second bit lines and the first complementary bit line, and $C_S$ represents the storage capacitance. Q takes on one of two different values depending on the data stored in the first ferroelectric capacitor 36.

The second potential ($V_{2BL}$), which is compared with the first potential ($V_{1BL}$), is produced at time t=8, when the first bit line BL1 and second complementary bit line /BL2 are electrically interconnected, but neither is connected to the second bit line BL2 or the first complementary bit line /BL1. Accordingly, the relevant bit-line capacitance ($C_{BL}$) is given by the following equation (3):

$$C_{BL}=C_{BL1}+C_{/BL2}\approx C_{BL1} \quad (3)$$

As a result, the bit-line capacitance has only about half the value at time t=3. The second potential ($V_{2BL}$) can thus be represented by the following equation (4).

$$V_{2BL} = q/(C_{BL1} + C_S) \quad (4)$$

In this equation, q represents the amount of charge transferred from the ferroelectric capacitor to the first bit line and second complementary bit line. When the first plate line PL1 is asserted at time t=8, the first ferroelectric capacitor 36 is polarized in a direction consistent with the applied voltage, having been polarized in this direction at time t=5. The consistent polarization results in less charge transfer than if the first ferroelectric capacitor 36 were polarized in the opposite state.

Therefore, if the bit-line capacitance ($C_{BL}$) has a value that places $V_{2BL}$ between the $V_{1BL}$ potential obtained when Q takes on the larger of its two values and the $V_{1BL}$ potential obtained when Q takes the smaller of its two values, the first potential $V_{1BL}$ will have a value $V_{1BLH}$ higher than the second potential $V_{2BL}$, or a value $V_{1BLL}$ lower than the second potential $V_{2BL}$, as noted above.

Figure 7:
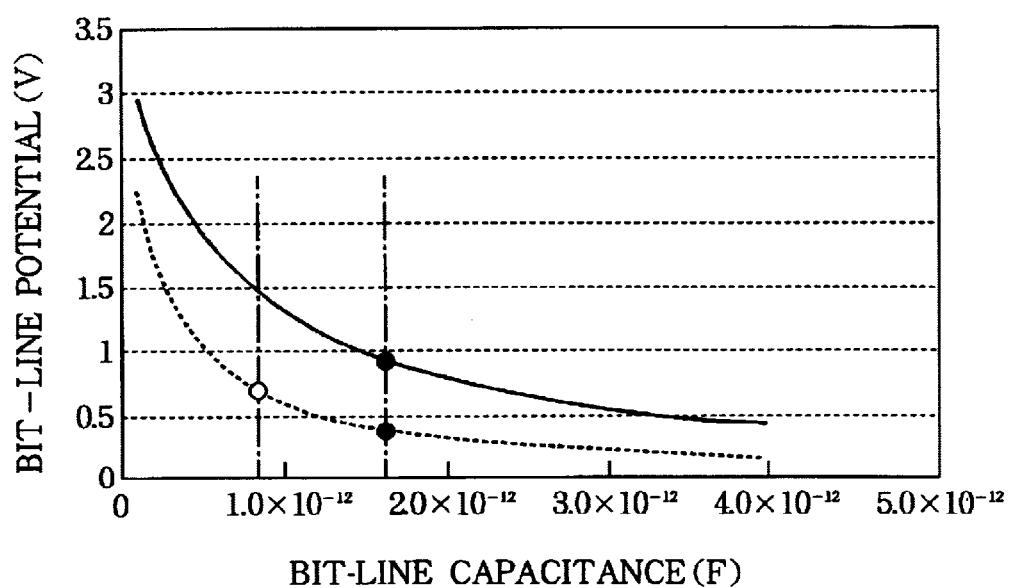
FIG. 7 is a graph plotting bit-line potential changes against bit-line capacitances for one example of a ferroelectric memory structured as in FIG. 5.

FIG. 7 is a graph plotting bit-line potential ($V_{1BL}$ or $V_{2BL}$) as a function of bit-line capacitance ($C_{BL}$) for one example of a ferroelectric memory device having the structure shown in FIG. 5. In FIG. 7, the solid curve indicates the potential when the first ferroelectric capacitor is polarized in the direction reverse to the applied voltage; the dashed curve indicates the potential when the first ferroelectric capacitor is polarized in the direction consistent with the applied voltage.

The characteristic curves in FIG. 7 are obtainable from a ferroelectric capacitor with the following parameters. The ferroelectric material is a $SrBi_2Ta_2O_9$ film one hundred fifty nanometers (150 nm) thick, having a remnant polarization value of seven microcoulombs per square centimeter (7.0 $\mu C/cm^2$). The capacitor area is 6.67 $\mu m$ and the power supply voltage Vcc 6.0 V.

From the curves shown in FIG. 7, if the capacitance ($C_{BL1}$) of the first bit line and the capacitance ($C_{BL2}$) of the second bit line are both one picofarad ($1.0 \times 10^{-12}$ F), then when the first plate line PL1 is asserted at time t=3, the first potential ($V_{1BL}$) on the first complementary bit line /BL1 is about 1 V if the first ferroelectric capacitor 36 is polarized in the negative direction, reverse to the applied voltage, so that the transferred charge Q is comparatively large, as indicated by the upper black dot on the solid curve in FIG. 7. If the first ferroelectric capacitor 36 is polarized in the positive direction, consistent with the applied voltage, so that the transferred charge Q is comparatively small, the first potential ($V_{1BL}$) is about 0.4 V, as indicated by the lower black dot on the dashed curve in FIG. 7. When the first plate line PL1 is asserted at time t=8, the second potential ($V_{2BL}$) on the second complementary bit line /BL2 is about 0.7 V, as indicated by the white dot on the dotted curve in FIG. 7.

Given these device characteristics, in the reading of the data stored in the first memory cell 32 in the ferroelectric memory device 30, when the sense amplifier 44 is activated at time t=9 and the first potential ($V_{1BL}$) is compared with the second potential ($V_{2BL}$), the potential difference is substantially 0.3 V. If one data value is stored, the first potential ($V_{1BL}$) is about 1 V ($V_{1BLH}$) and the second voltage ($V_{2BL}$) is about 0.7 V; if the other data value is stored, the first potential ($V_{1BL}$) is about 0.4 V ($V_{1BLL}$), and the second potential ($V_{2BL}$) is about 0.7 V.

With the above parameters, accordingly, the second potential ($V_{2BL}$) is positioned midway between the two values taken by the first potential ($V_{1BLH}$ and $V_{1BLL}$). Thus, the data can be read correctly by comparing the first potential ($V_{1BL}$) with the second potential ($V_{2BL}$).

In this embodiment, each memory cell generates its own reference potential, eliminating the need for a separate dummy capacitor or reference voltage generator and making it possible to realize a 1T1C ferroelectric memory with a very simple structure. Current consumption can also be reduced because the bit lines BL1 and BL2 do not have to be precharged to the reference potential. When switches SW5 and SW6 are turned on, it is only to bring the bit lines to the ground potential.

Figure 6:
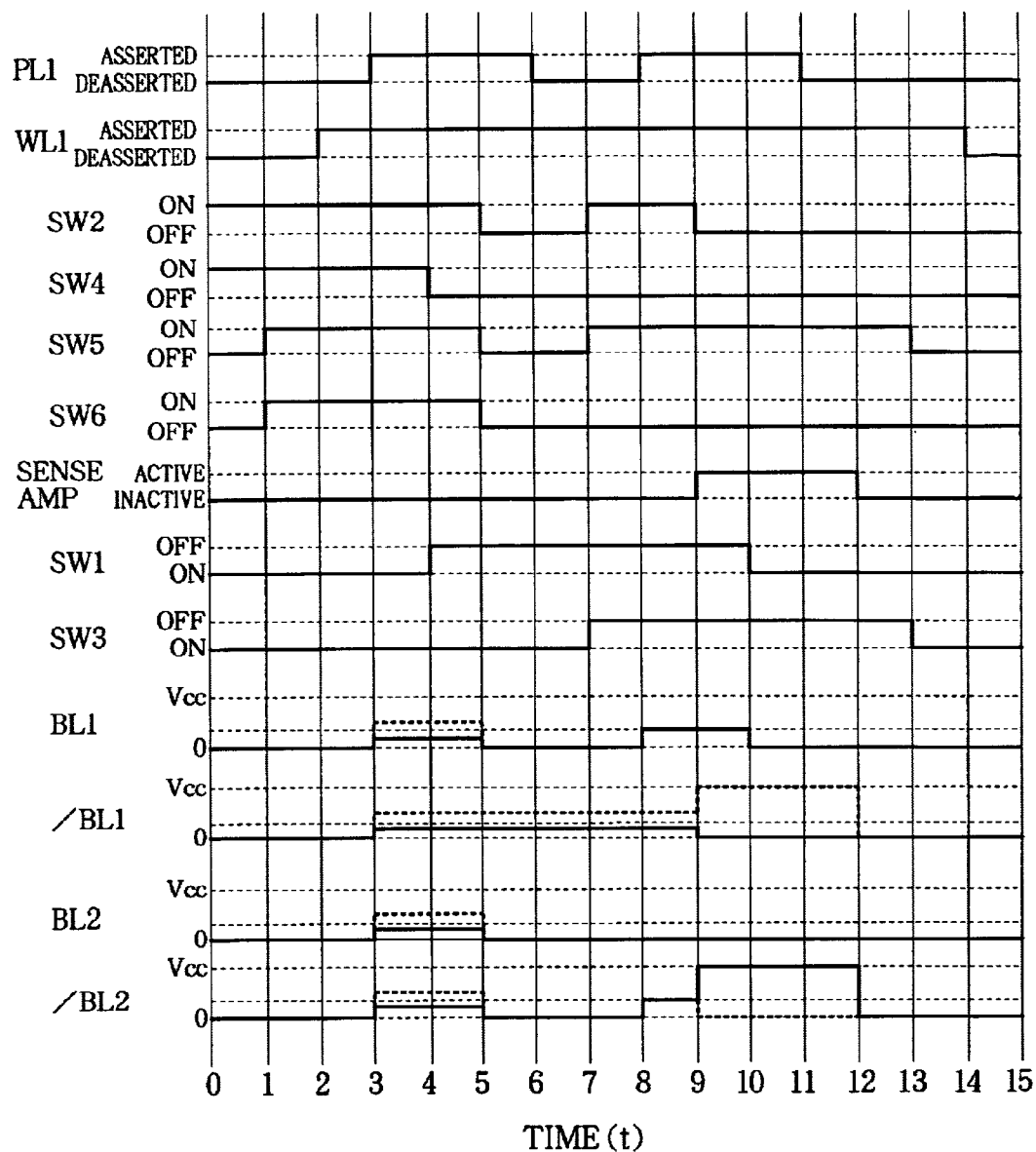
FIG. 6 is a timing diagram indicating potential changes and state changes when the ferroelectric memory in FIG. 5 is read.

The sequence in FIG. 6 can be altered in various ways. For example, switch SW2 may be switched off at a time other than time t=5, or may be left on from time t=1 until time t=9.

The potential to which the bit lines BL1 and BL2 are driven when switches SW5 and SW6 are turned on does not have to be the ground potential, but may be a fixed potential above or below the ground level. Various choices are also possible for the asserted and deasserted levels of the plate lines.

Those skilled in the art will recognize that further variations are possible within the scope of the appended claims.

What is claimed is:

1. A ferroelectric memory including at least one memory cell for storing data, the memory cell having a ferroelectric capacitor and a selection transistor, the ferroelectric memory also including a bit line, a word line, and a plate line, the ferroelectric capacitor having a first electrode and a second electrode, the second electrode being connected to the plate line, the selection transistor having a control electrode connected to the word line, a first main electrode connected to the first electrode of the ferroelectric capacitor, and a second main electrode connected to the bit line, the ferroelectric memory also including:

a sense amplifier having a first terminal and a second terminal, the first terminal being connected to the bit line;

a plate line driver having an output terminal connected to the plate line, for selectively supplying a ground potential, a first voltage differing from the ground potential, and a second voltage higher than the first voltage to the plate line;

a switch connected to the bit line;

a first pre-charge circuit connected to the switch, for selectively supplying the ground potential and the first voltage through the switch to the bit line; and a second pre-charge circuit connected to the second terminal of the sense amplifier, for supplying the first voltage to the sense amplifier; wherein to read data stored in the memory cell, the plate line driver supplies the first voltage, then the second voltage, then the ground potential, then the first potential to the plate line, and the sense amplifier compares a resulting potential on the bit line with the first voltage.

2. The ferroelectric memory of claim 1, wherein the ferroelectric memory receives power at a power supply voltage, and the first voltage is higher than the ground potential but lower than the power supply voltage.

3. The ferroelectric memory of claim 1, wherein the ferroelectric memory receives power at a power supply voltage, the first voltage is equal to one-half of the power supply voltage, and the second voltage is equal to the power supply voltage.

4. The ferroelectric memory of claim 1, wherein the plate line driver includes a power-supply node, a ground node, and a pair of switches having predetermined on-resistances, coupled in series between the power-supply node and the ground node.

5. The ferroelectric memory of claim 1, wherein the first pre-charge circuit includes a power-supply node, a ground node, and a pair of switches having predetermined on-resistances, coupled in series between the power-supply node and the ground node.

6. The ferroelectric memory of claim 1, wherein the second pre-charge circuit includes a power-supply node, a ground node, and a pair of switches having predetermined on-resistances, coupled in series between the power-supply node and the ground node.

7. A method of operating the ferroelectric memory of claim 1, including:
   applying the first voltage to the plate line and the bit line;
   disconnecting the first pre-charge circuit from the bit line by turning the switch off, thereby placing the bit line in an electrically floating state;
   asserting the word line, thereby placing the selection transistor in a conducting state;
   applying the second voltage, then the ground potential, then the first voltage to the plate line;
   activating the sense amplifier, and simultaneously applying the second voltage from the plate line driver to the plate line;
   applying the ground potential from the plate line driver to the plate line;
   deasserting the word line; and
   deactivating the sense amplifier, and simultaneously connecting the first pre-charge circuit to the bit line by turning on the switch.

8. A ferroelectric memory including an array of memory cells, a plurality of word lines, a plurality of bit lines, a plurality of plate lines, and an access circuit, each memory cell in the array of memory cells having a ferroelectric capacitor and a selection transistor coupled in series between one of the bit lines and one of the plate lines, the selection transistor having a control electrode connected to one of the word lines, the access circuit being connected to the word lines and the plate lines, the access circuit reading data from a selected memory cell in the array of memory cells by turning on the selection transistor in the selected memory cell and automatically applying different voltages to the one of the plate lines to which the ferroelectric capacitor in the selected memory cell is connected, the ferroelectric memory also including:
   a sense amplifier having a first terminal and a second terminal, the first terminal being connected to one of the bit lines; and
   a pre-charge circuit for generating a reference potential and supplying the reference potential to the second terminal of the sense amplifier.

9. The ferroelectric memory of claim 8, wherein the reference potential is equal to one of the different voltages applied to said one of the plate lines by the access circuit.

10. A ferroelectric memory having a first memory cell, a first bit line, a first plate line, a first word line, a second memory cell, a second bit line, a second plate line, a second word line, a first complementary bit line, and a second complementary bit line, the first memory cell having a first ferroelectric capacitor with a first electrode and a second electrode, the second electrode of the first ferroelectric capacitor being coupled to the first plate line, the first memory cell also having a first selection transistor with a first main electrode connected to the first electrode of the first ferroelectric capacitor, a second main electrode connected to the first bit line, and a control electrode connected to the first word line, the second memory cell having a second ferroelectric capacitor with a first electrode and a second electrode, the second electrode of the second ferroelectric capacitor being coupled to the second plate line, the second memory cell also having a second selection transistor with a first main electrode connected to the first electrode of the second ferroelectric capacitor, a second main electrode connected to the second bit line, and a control electrode connected to the second word line, the ferroelectric memory device also including:
   a first switch interconnecting the first bit line and the first complementary bit line;
   a second switch interconnecting the first bit line and the second complementary bit line;
   a third switch interconnecting the second bit line and the second complementary bit line;
   a fourth switch interconnecting the second bit line and the first complementary bit line; and
   a sense amplifier connected to the first complementary bit line and the second complementary bit line.

11. A method of operating the ferroelectric memory of claim 10, including:
   electrically interconnecting the first bit line, the second bit line, the first complementary bit line, and the second complementary bit line by turning on the first switch, the second switch, the third switch, and the fourth switch, driving the first bit line, the second bit line, the first complementary bit line, and the second complementary bit line to a fixed potential, then leaving the first bit line, the second bit line, the first complementary bit line, and the second complementary bit line in an electrically floating state;
   asserting the first word line, thereby placing the first selection transistor in a conducting state, then asserting the first plate line, thereby placing a first potential responsive to data stored in the first memory cell on the first bit line, the second bit line, the first complementary bit line, and the second complementary bit line;
   disconnecting the first bit line and second bit line from the first complementary bit line by turning off the first switch and fourth switch, thereby leaving the first complementary bit line in an electrically floating state at the first potential;
   driving the first bit line, the second bit line, and the second complementary bit line to said fixed potential;
   deasserting the first plate line, then disconnecting the second bit line from the second complementary bit line by turning the third switch off, and leaving the first bit line and the second complementary bit line interconnected through the second switch and electrically floating at said fixed potential;
   reasserting the first plate line, thereby producing a second potential on the first bit line and the second complementary bit line;
   turning off the second switch, then activating the sense amplifier, thereby comparing the first potential on the first complementary bit line with the second potential on the second complementary bit line;
   turning on the first switch, thereby electrically connecting the first bit line and the first complementary bit line;
   deasserting the first plate line; and
   deactivating the sense amplifier.

12. The method of claim 11, wherein the fixed potential is a ground potential.

13. The method of claim 11, further including:

turning off the second switch when driving the first bit line, the second bit line, and the second complementary bit line to said fixed potential; and turning on the second switch when reasserting the first plate line.

* * * * *